United States Patent
Yabe

(10) Patent No.: US 11,336,283 B1
(45) Date of Patent: May 17, 2022

(54) LEVEL SHIFTER WITH IMPROVED NEGATIVE VOLTAGE CAPABILITY

(71) Applicant: SANDISK TECHNOLOGIES LLC, Addison, TX (US)

(72) Inventor: Hiroki Yabe, Yokohama (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 17/326,487

(22) Filed: May 21, 2021

(51) Int. Cl.
*H03K 19/0185* (2006.01)
*G11C 16/00* (2006.01)
*G11C 16/08* (2006.01)
*H03K 3/356* (2006.01)

(52) U.S. Cl.
CPC ........... *H03K 19/018521* (2013.01); *H03K 3/356113* (2013.01); *H03K 3/356182* (2013.01)

(58) Field of Classification Search
None
See application file for complete search history.

(56) References Cited

U.S. PATENT DOCUMENTS

| | | | |
|---|---|---|---|
| 7,274,603 B2 * | 9/2007 | Futatsuyama | G11C 16/08 365/185.23 |
| 9,589,642 B2 * | 3/2017 | Chang | G11C 8/10 |
| 9,608,615 B2 * | 3/2017 | Moscaluk | G11C 11/417 |

* cited by examiner

*Primary Examiner* — Kenneth B Wells
(74) *Attorney, Agent, or Firm* — Morgan Lewis & Bockius LLP

(57) ABSTRACT

A level shifting circuit includes negative voltage shifting circuitry including a first leg and a second leg. The first leg includes a first plurality of NMOS transistors in series with a first input node and a negative amplified voltage, and the second leg includes a second plurality of NMOS transistors in series with a second input node and the negative amplified voltage. The level shifting circuit further includes positive voltage shifting circuitry including a first plurality of high voltage transistors in series with a positive amplified voltage and an output node of the level shifting circuit, and a second plurality of high voltage transistors in series with a first intermediate node of the first leg of the negative voltage shifting circuitry and the output node of the level shifting circuit. The level shifting circuitry further includes input circuitry including a plurality of inverters.

20 Claims, 11 Drawing Sheets

LEVEL SHIFTER WITH IMPROVED NEGATIVE VOLTAGE CAPABILITY

TECHNICAL FIELD

This application relates generally to integrated circuit semiconductor devices, and, more specifically, to level shifting circuits that can supply also negative voltages.

BACKGROUND

In an integrated circuit, it is common to need a circuit to provide a voltage from a source to an output in response to an input signal. An example is a word line decoding circuit of in a non-volatile memory. In such a circuit, a relatively high programming voltage is supplied to a word line in response to an input signal at device logic level. For example, in fairly typical values for a NAND type FLASH memory, 10-30V is provided on a word line in response to an input going from ground to "high" value of VDD in the ~2-5V range for typical current devices. Such level shifters that are capable of handling such high voltages find use in multiple places in the peripheral circuitry of programmable non-volatile memories.

To improve the operation of level shifting circuits, it is important that the voltage on the output reaches its full value quickly when enabled and also that level shifter turns off quickly when disabled. A number of designs for such switches use NMOS transistors and a local charge pump to raise the gate voltage values used to turn on the transistor and pass the high voltage from the source to the output. Such level shifters have typically been designed to only pass positive voltages, or slightly negative voltages. In some applications, including some non-volatile memory designs, there is also a need to pass increasingly negative voltages. Consequently, there is an ongoing need for level shifter circuits capable of handling high positive voltages and high negative voltages.

SUMMARY

The implementations included herein describe an improved level shifting circuit that provides increasingly negative voltages without violating acceptable voltage range (AVR) characteristics of the transistors used in the circuit.

In one aspect, a level shifting circuit, comprises negative voltage shifting circuitry including a first leg and a second leg, wherein the first leg includes a first plurality of NMOS transistors in series with a first input node and a negative amplified voltage; and the second leg includes a second plurality of NMOS transistors in series with a second input node and the negative amplified voltage.

In some implementations, the level shifting circuit further includes positive voltage shifting circuitry including a first plurality of high voltage transistors in series with a positive amplified voltage and an output node of the level shifting circuit; and a second plurality of high voltage transistors in series with a first intermediate node of the first leg of the negative voltage shifting circuitry and the output node of the level shifting circuit.

In some implementations, the level shifting circuitry further includes input circuitry including a plurality of inverters, each including a PMOS transistor and an NMOS transistor in series with a positive supply voltage and a negative or zero supply voltage, wherein a first inverter of the plurality of inverters inverts an input signal of the level shifting circuit and outputs a first inverted input signal; a second inverter of the plurality of inverters inverts the first inverted input signal and outputs a second inverted input signal to the first leg of the negative voltage shifting circuitry; and a third inverter of the plurality of inverters inverts the second inverted input signal and outputs a third inverted input signal to the second leg of the negative voltage shifting circuitry.

In some implementations, the negative voltage shifting circuitry is configured to provide the negative amplified voltage to the second plurality of high voltage transistors of the positive voltage shifting circuitry via the first intermediate node of the first leg of the negative voltage shifting circuitry when the input signal is the negative or zero supply voltage; and provide the second inverted input signal to the second plurality of high voltage transistors of the positive voltage shifting circuitry via the first intermediate node of the first leg of the negative voltage shifting circuitry when the input signal is the positive supply voltage.

In some implementations, the positive voltage shifting circuitry is configured to provide the negative amplified voltage at the output node of the level shifting circuitry when the first intermediate node of the first leg of the negative voltage shifting circuitry is the negative amplified voltage; and provide the positive amplified voltage at the output node of the level shifting circuitry when the first intermediate node of the first leg of the negative voltage shifting circuitry is the positive supply voltage.

In some implementations, the second plurality of high voltage transistors of the positive voltage shifting circuitry include a first NMOS transistor having a gate connected to the first intermediate node of the first leg of the negative voltage shifting circuitry; and a first PMOS transistor having a gate connected to the first intermediate node of the first leg of the negative voltage shifting circuitry.

In some implementations, the negative or zero supply voltage is between −0.5V and 0V; the negative amplified voltage is between −4.5V and −3.5V; the positive supply voltage is between 2V and 3V; the positive amplified voltage is between 15V and 20V; and a gate-to-source voltage and a drain-to-source voltage of the first PMOS transistor satisfy an acceptable voltage range (AVR) rating of the first PMOS transistor while the output node of the level shifting circuitry switches between the positive amplified voltage and the negative amplified voltage.

In some implementations, the level shifting circuit further includes a high voltage pull-down transistor connected to the source of the first PMOS transistor and the negative amplified voltage, and configured to be controlled by a second intermediate node of the second leg of the negative voltage shifting circuitry.

In some implementations, the input circuitry is configured to output the second inverted input signal to the first leg of the negative voltage shifting circuitry before outputting the third inverted input signal to the second leg of the negative voltage shifting circuitry.

In some implementations, the first plurality of NMOS transistors of the negative voltage shifting circuitry include a first NMOS transistor having its gate cross-coupled to the second input node, and a second NMOS transistor having its gate cross-coupled to the second intermediate node; and the second plurality of NMOS transistors of the negative voltage shifting circuitry include a first NMOS transistor having its gate cross-coupled to the first input node, and a second NMOS transistor having its gate cross-coupled to the first intermediate node.

In some implementations, the positive amplified voltage and the negative amplified voltage are read voltages for a plurality of word lines of a memory array of a data storage device.

Various implementations of systems and methods within the scope of the appended claims each have several aspects, no single one of which is solely responsible for the desirable attributes described herein. Without limiting the scope of the appended claims, some prominent features are described. After considering this discussion, and particularly after reading the section entitled "Detailed Description" one will understand how the features of various implementations are used to improve performance at the interface.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

Figure 1:
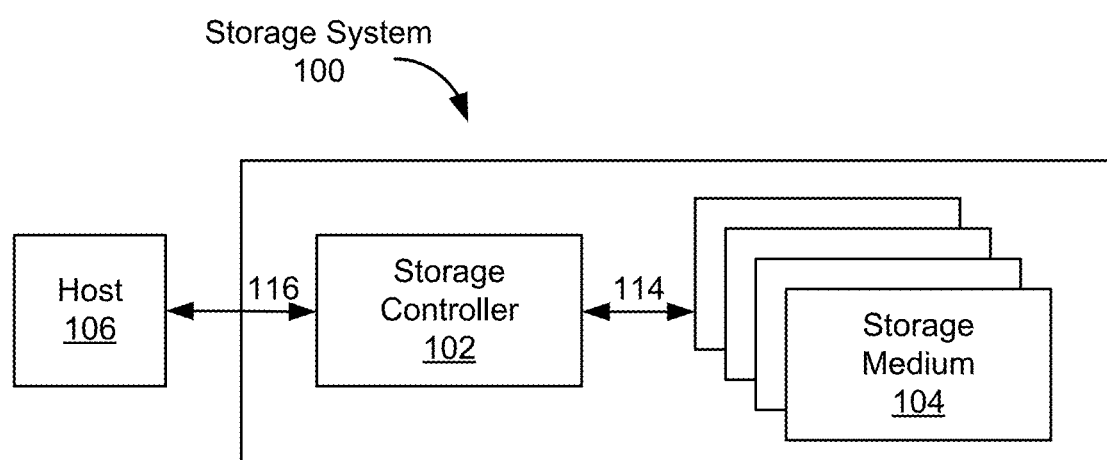
FIG. 1 is a functional block diagram of a non-volatile storage system in accordance with some implementations.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals are used to denote like features throughout the specification and figures.

DETAILED DESCRIPTION

FIG. 1 is a functional block diagram of a non-volatile storage system in accordance with some implementations. Storage system 100 includes a storage controller 102 (sometimes referred to as a flash memory controller) and non-volatile memory that may be made up of one or more storage mediums 104 (sometimes referred to as memory dies). As used herein, the term storage medium (or memory die) refers to a plurality of non-volatile memory cells (e.g., one or more memory arrays), and associated circuitry (e.g., peripheral circuitry) for managing the physical operation of the non-volatile memory cells. In some implementations, the memory cells and associated circuitry are formed on a single semiconductor substrate. Storage controller 102 interfaces with a host system 106 (also referred to as a host) and transmits command sequences for read, program, and erase operations to storage medium(s) 104. Throughout this disclosure, reference may be made to a single storage medium 104. However, it should be understood that such features may additionally or alternatively be implemented across a plurality of storage mediums 104.

The storage controller 102 manages data stored on one or more storage mediums 104 (e.g., flash memory) and communicates with a host 106, such as a computer or electronic device. The storage controller 102 can have various functionality in addition to the specific functionality described herein. For example, the storage controller 102 can format the storage medium 104 to ensure the memory is operating properly, map out bad memory cells, and allocate spare memory cells to be substituted for future failed memory cells. Some part of the spare memory cells can be used to hold firmware to operate the storage controller 102 and implement other features.

In operation, when the host 106 needs to read data from or write data to a storage medium 104, the host 106 communicates with the storage controller 102. If the host 106 provides a logical address to which data is to be read/written, the storage controller 102 may convert the logical address received from the host 106 to a physical address in the storage medium 104. Alternatively, the host 106 may provide the physical address. The storage controller 102 may also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The storage medium(s) 104 may include any suitable non-volatile storage medium, including NAND flash memory cells and/or NOR flash memory cells. The memory cells can take the form of solid-state (e.g., flash) memory cells and can be one-time programmable, few-time programmable, or multi-time programmable. The memory cells can also be single-level cells (SLC), multiple-level cells (MLC), triple-level cells (TLC), quad-level cells (QLC), or use other memory cell level technologies. Also, the memory cells can be fabricated in a two-dimensional or three-dimensional fashion.

The interface between the storage controller 102 and the storage medium(s) 104 may be any suitable flash interface, such as Toggle Mode or Open NAND Flash Interface (ONFI).

In some implementations, storage system 100 may be a card-based system, such as a secure digital (SD) or a micro secure digital (micro-SD) card. In some implementations, storage system 100 may be part of an embedded storage system. For example, the storage controller 102 and storage medium(s) 104 may be embedded within the host 106, such as in the form of a solid-state disk (SSD) drive installed in a computer. Such an SSD may emulate, replace, or be used instead of a hard disk drive inside the host 106, or be used as a NAS device, and so forth. In any case, such an SSD need not be made to work as a hard drive.

Although in the example illustrated in FIG. 1, storage system 100 includes a single channel between storage controller 102 and storage medium 104, the subject matter described herein is not limited to having a single memory channel. For example, in some storage system architectures, two, four, eight, or more channels may exist between the storage controller 102 and the storage medium(s) 104, depending on controller capabilities. In any of the implementations described herein, a plurality of channels may exist between the storage controller 102 and the storage medium(s) 104, even if a single channel is depicted in the drawings.

In some implementations, an intermediate storage controller (not shown) may interface the host 106 with the storage controllers 102 of a plurality of storage systems 100. The interface between the intermediate storage controller and the plurality of storage systems 100 may be a bus interface, such as a serial advanced technology attachment (SATA) or peripheral component interface express (PCIe) interface. The plurality of storage systems 100 may be implemented in a solid state drive (SSD), such as found in portable computing devices, such as laptop computers, tablet computers, or mobile devices.

In some implementations, a plurality of intermediate storage controllers (not shown) may respectively interface the host 106 with the storage controllers 102 of a plurality of storage systems 100. Such a system may be referred to as a hierarchical storage system. The host 106 may access memories within the storage systems 100 via a bus interface. In some implementations, the bus interface may be an NVMe or fiber channel over Ethernet (FCoE) interface. In some implementations, a hierarchical storage system may be a rack mountable mass storage system that is accessible by multiple host 106 computers, such as would be found in a data center or other location where mass storage is needed.

Figure 2:
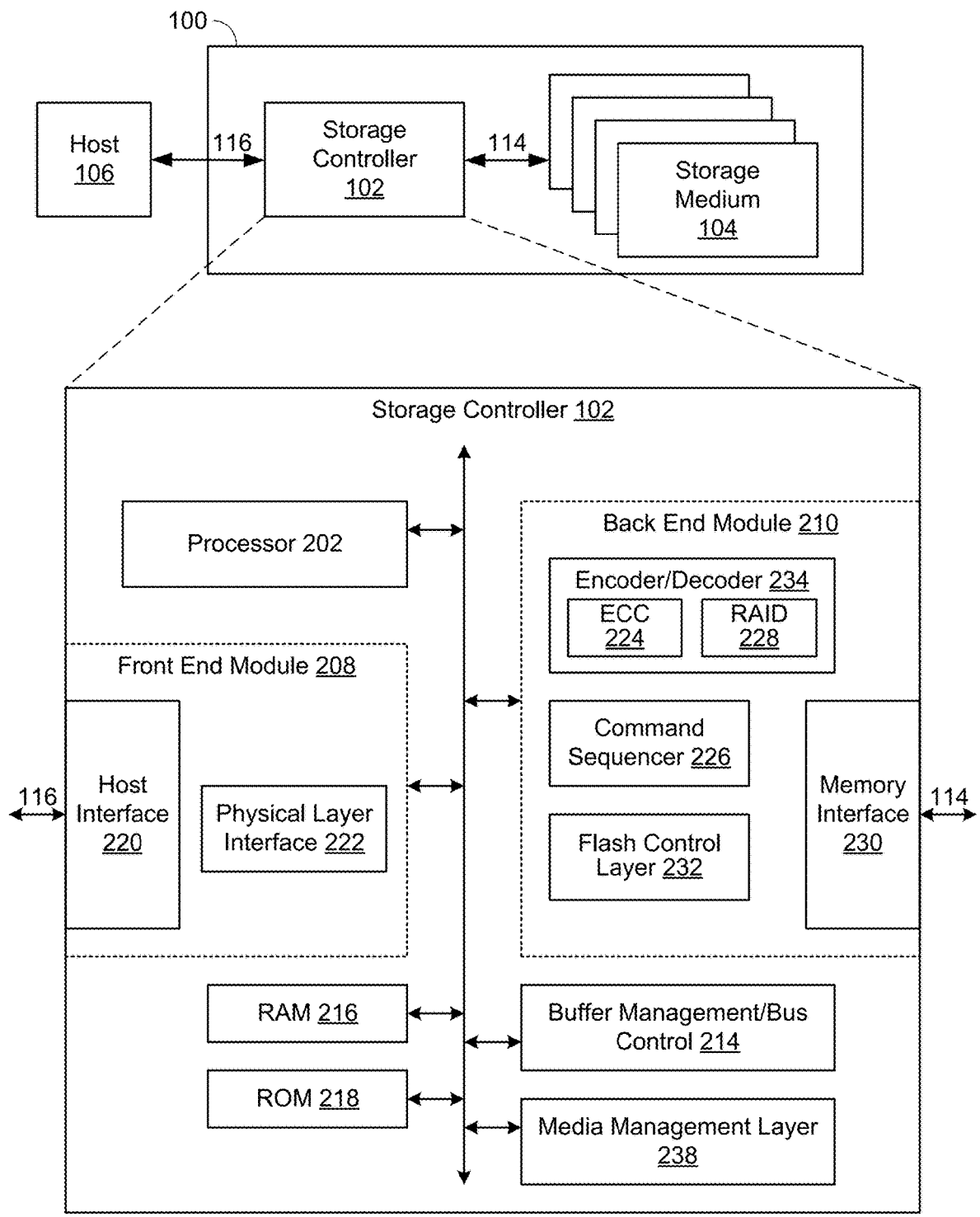
FIG. 2 is a functional block diagram of an example storage controller of the storage system depicted in FIG. 1 in accordance with some implementations.

FIG. 2 is a functional block diagram of an example storage controller 102 of the storage system 100 in accordance with some implementations. Storage controller 102 includes a front-end module 208 that interfaces with a host 106, a back-end module 210 that interfaces with one or more non-volatile storage mediums 104, and various other modules that perform functions described herein.

The storage controller 102 can take the form of processing circuitry, a microprocessor or processor, and a non-transitory computer-readable medium that stores computer-readable program code (e.g., firmware) executable by the (micro) processor, logic gates, switches, an application specific integrated circuit (ASIC), a programmable logic controller, and/or an embedded microcontroller, for example. Storage controller 102 can be configured with hardware and/or firmware to perform the various functions described herein. Also, some of the components shown as being internal to the storage controller 102 (e.g., RAM 216 and ROM 218) can also be stored external to the storage controller 102, and other components can be used. Additionally, the phrase "operatively in communication with" could mean directly in communication with or indirectly (wired or wireless) in communication with through one or more components, which may or may not be shown or described herein.

The components of storage controller 102 depicted in FIG. 2 may take the form of a packaged functional hardware unit (e.g., an electrical circuit) designed for use with other components, a portion of a program code (e.g., software or firmware) executable by a (micro)processor or processing circuitry (or one or more processors) that usually performs a particular function or related functions, or a self-contained hardware or software component that interfaces with a larger system. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include or comprise software stored in a processor readable device (e.g., memory) to program one or more processors for storage controller 102 to perform the functions described herein.

The storage controller 102 may include a buffer manager/bus controller 214, configured to manage buffers in random access memory (RAM) 216 and control the internal bus arbitration of the storage controller 102. A read only memory (ROM) 218 may store system boot code. Although illustrated in FIG. 2 as located within the storage controller 102, in some implementations one or both of the RAM 216 and ROM 218 may be located separately from the storage controller 102. In yet other implementations, portions of RAM 216 and ROM 218 may be located both within the storage controller 102 and outside the storage controller 102. Further, in some implementations, the storage controller 102, RAM 216, and ROM 218 may be located on separate semiconductor dies.

The storage controller 102 may include one or more processors 202 configured to control the overall operation of the storage controller 102. The processor 202 may issue commands to control circuitry 310 (FIG. 3) of storage medium 104, or to any other component of storage medium 104, via memory interface 230. In some implementations, the ROM 218 and/or RAM 216 may comprise code such as a set of instructions, and the processor 202 may be operable to execute the set of instructions to provide the functionality described herein. Additionally or alternatively, the processor 202 may access code from a portion of the memory array 350 (FIG. 3) in the storage medium 104, such as a reserved area of memory cells connected to one or more word lines.

The front-end module 208 includes a host interface 220 that provides a communication interface with the host 106. The choice of the type of host interface 220 can depend on the type of memory being used. Examples of host interfaces include, but are not limited to, SATA, SATA Express, SAS, Fibre Channel, USB, PCIe, and NVMe. The host interface 220 is a communication interface that facilitates transfer for data, control signals, and timing signals. The host interface 220 may include electrical interface circuitry that provides a physical connection to the channel(s) 116 connecting the storage controller 102 to the host. This electrical interface circuitry may be part of the host interface 220, or may be separately described as a physical layer interface 222.

In some implementations, the host interface 220, in communication with ROM 218, RAM 216, and/or processor 202, may be an electrical circuit that provides an electrical interface between the storage controller 102 and the host 106. For example, the host interface 220 may change the format or timing of signals, provide a buffer, isolate from surges, latch I/O, and so forth. Commands and data from the host 106 are received by the storage controller 102 via the host interface 220. Data sent to the host 106 is transmitted via the host interface 220.

The back-end module 210 includes a memory interface 230 that provides command sequences and data (to be written) to storage medium(s) 104 and receives status information and data (that was read) from storage medium(s) 104. In some implementations, the memory interface 230 may be a double data rate (DDR) interface such as Toggle Mode or ONFI.

In some implementations, the memory interface 230, in communication with ROM 218, RAM 216, and/or processor 202, may be an electrical circuit that provides an electrical interface between the storage controller 102 and the storage medium 104. For example, the memory interface 230 may change the format or timing of signals, provide a buffer, isolate from surges, latch I/O, and so forth.

The back-end module 210 may include an error correction controller (ECC) engine 224 and/or a Redundant Array of Independent Dies (RAID) module 228. The ECC engine 224 may be configured to encode data received from the host 106, and decode and error correct data read from the storage medium 104. The RAID module 228 may be configured to manage generation of RAID parity and recovery of failed data. The RAID parity may be used as an additional level of integrity protection for the data being written into the storage medium 104. In some implementations, the RAID module 228 may be a part of the ECC engine 224. The RAID parity may be added as an extra die or dies as implied by the common name, but it may also be added within the existing die, e.g., as an extra plane, or extra block, or extra WLs within a block. ECC engine 224 and RAID module 228 may both calculate redundant data that can be used to recover when errors occur and may be considered examples of redundancy encoders. Together, ECC engine 224 and RAID module 228 may be considered to form a combined redundancy encoder/decoder 234.

The back-end module 210 may include a command sequencer 226, and/or a flash control layer 232. The command sequencer 226 may generate command sequences, such as program and erase command sequences, for transmission to storage medium 104. The flash control layer 232 may control the overall operation of the back-end module 210.

The storage controller 102 may include a media management layer 238, which performs wear leveling of memory cells of storage medium 104. The storage controller 102 may also include other discrete components (not shown), such as external electrical interfaces, external RAM, resistors, capacitors, or other components that may interface with storage controller 102. In some implementations, one or more of the physical layer interface 222, RAID module 228, media management layer 238 and buffer management/bus controller 214 are optional components that are not necessary in the storage controller 102.

The Flash Translation Layer (FTL) or Media Management Layer (MML) 238 may be integrated as part of the flash management that may handle flash errors and interfacing with the host 106. In particular, the MML 238 may be a module in flash management and may be responsible for the internals of NAND management. In particular, the MML 238 may include an algorithm in the storage device firmware which translates writes from the host 106 into writes to the storage medium 104. The MML 238 may be needed because: 1) storage medium 104 may have limited endurance; 2) storage medium 104 may only be written in multiples of pages; and/or 3) a selected portion of memory cells of the storage medium 104 may not be written unless it is erased as a block (i.e. a block may be considered to be a minimum unit of erase and such a non-volatile memory may be considered a block-erasable non-volatile memory). The MML 238 may address these potential limitations of the storage medium 104 which may not be visible to the host 106. Accordingly, the MML 238 may translate write operations received from the host 106 into write operations for transmission to the storage medium 104.

Figure 3:
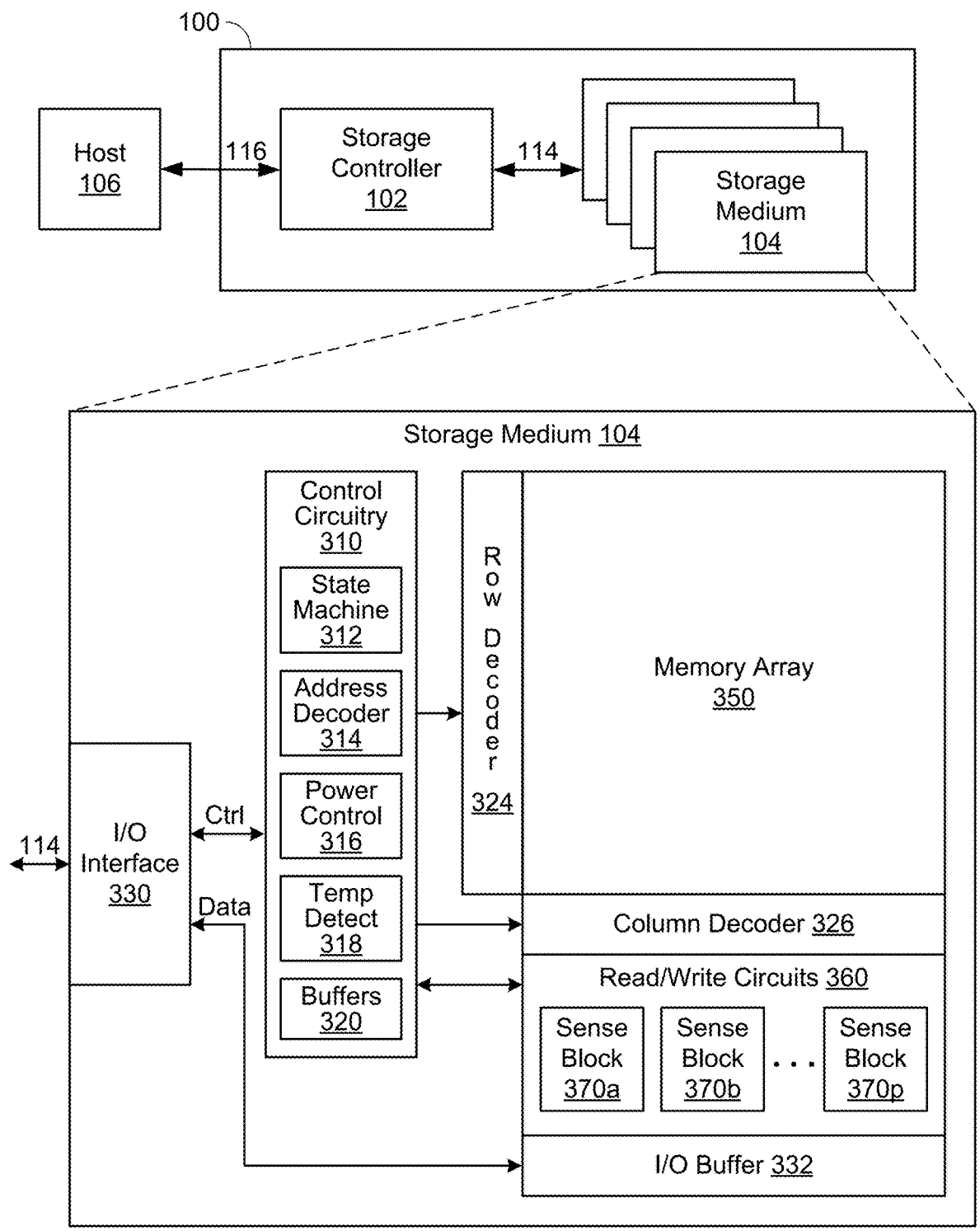
FIG. 3 is a functional block diagram of an example storage medium of the storage system depicted in FIG. 1 in accordance with some implementations.

FIG. 3 is a functional block diagram of an example storage medium 104 of the storage system 100 in accordance with some implementations. Storage medium 104 includes a memory array 350 including a plurality of memory cells, control circuitry 310, read/write circuits 360, and an input/output (I/O) interface 330.

In some implementations, a storage controller 102 (as described above with reference to FIG. 2) may included in the same storage device (e.g., a removable storage card) as the storage medium(s) 104. However, in other implementations, the storage controller 102 may be separated from the storage medium(s) 104. In some implementations, the storage controller 102 may be disposed on a different die than the storage medium 104. In some implementations, one storage controller 102 may communicate with a plurality of storage mediums 104. In some implementations, each storage medium 104 may have its own storage controller 102.

Commands and data may be transferred between the host 106 and the storage controller 102 via a data bus 116, and between the storage controller 102 and storage medium(s) 104 via an interface channel 114. In some implementations, the I/O interface 330 includes a set of I/O pins (also referred to as pads) that connect to respective communication lines of the interface channel 114. The I/O interface 330 may be connected to the control circuitry 310, row decoder 324, column decoder 326, read/write circuits 360, and/or memory array 350.

The I/O interface 330 may be a synchronous interface or an asynchronous interface. Examples of an I/O interface include a Toggle Mode Interface and an Open NAND Flash Interface (ONFI). Other I/O interfaces can also be used. Toggle mode (e.g., Toggle Mode 2.0 JEDEC Standard or Toggle Mode 900) is an asynchronous memory interface that supports SDR and DDR with a DQS signal acting as a data strobe signal.

Data received at the I/O interface 330 for writing to the memory array 350 (in accordance with a write command) is latched in an I/O buffer 332 before being written to the memory array 350. Similarly, data that is read from the memory array 350 (in accordance with a read command) is latched in the I/O buffer 332 before being transmitted to the storage controller 102 via the I/O interface 330. The I/O buffer 332 may be included in the I/O interface 330 or otherwise communicatively coupled to the I/O interface 330. The I/O buffer 332 includes a plurality of data latches. In some implementations, the data latches are arranged in groups of 8 (XDL0 through XDL7) or 16 (XDL0 through XDL15), depending on how many bits the I/O interface 330 is configured to receive or transmit at a time.

The read/write circuits 360 include multiple sense blocks 370 including 370a through 370p (sensing circuitry) and allow a page (or multiple pages) of data in multiple memory cells of the memory array 350 to be read or programmed (written) in parallel. In some implementations, each sense block 370 includes one or more sense amplifiers connected to respective bit lines of the memory array 350. The sense amplifiers sense voltage signals associated with selected memory cells (e.g., determining whether a given memory cell is conducting current during a sense operation, or how much current the given memory cell conducts during the sense operation). The sense amplifiers then amplify the sensed voltages to levels that are optimized for the I/O circuitry of the storage medium 104, interface channel 114, and storage controller 102.

Each bit line of the memory array 350 is coupled to a sense block 370, each of which includes one or more sense amplifiers. The sense amplifiers sense voltages on each bit line in accordance with read operations. The sense amplifiers sense the low power signals from respective bit lines that represents data bits (1 or 0) stored in respective memory cells. The sense amplifiers amplify small voltage swings to recognizable logic levels so the data can be interpreted properly by logic outside the memory array (e.g., storage controller 102). After a sense amplifier for a particular bit line amplifies the sensed voltage to a normal logic level, the bit from the desired cell is then latched from the cell's sense amplifier into a data latch in the I/O buffer 332, and transferred to the storage controller 102 on data lines DQ of the output bus 114.

The sense amplifiers sense data read onto corresponding bit lines from a plurality of memory cells associated with the corresponding bit lines. The sense amplifiers may include bit line drivers for applying a voltage to corresponding bit lines in accordance with write data. The sense amplifier for a given bit line or group of bit lines may directly control the bit line(s). In data reading, the read/write circuits 360 may apply a strobe signal to a given sense amplifier. The sense amplifier determines data at the assertion timing of the strobe signal (e.g., an ON state of a memory cell may be defined as data "0", and an off state may be defined as data "1"). This data may be held in an internal latch SADL of the sense amplifier before being transferred to one of the data latches of the I/O buffer 332.

Input and output of data to and from the sense amplifiers are performed via the data latches of the I/O buffer 332. That is, data received from the storage controller 102 is transferred to sense amplifiers via the data latches. In addition, data in the sense amplifiers (in internal latches of the sense amplifiers) is transmitted to the storage controller 102 via the data latches. The data latches of the I/O buffer 332 may function as the cache memory of the storage medium 104.

The control circuitry 310 cooperates with the read/write circuits 360 to perform memory operations (e.g., write, read, erase, and others) on the memory array 350. In some implementations, control circuitry 310 includes a state machine 312, an on-chip address decoder 314, a power control circuit 316, a temperature detection circuit 318, and/or buffers 320.

The state machine 312 provides die-level control of memory operations. In some implementations, the state machine 312 is programmable by software. In other implementations, the state machine 312 does not use software and is completely implemented in hardware (e.g., electrical circuits). In some implementations, the state machine 312 can be replaced by a microcontroller or microprocessor.

The address decoder 314 provides an address interface between addresses used by the host 106 or storage controller 102 to the hardware address used by the decoders 324 and 326.

The power control module 316 controls the power and voltages supplied to the word lines and bit lines during memory operations. It can include drivers for word line layers (discussed below) in a 3D configuration, select transistors (e.g., SGS and SGD transistors, described below) and source lines. Power control module 316 may include charge pumps for creating voltages.

The temperature detection circuit 318 may be configured to detect temperature in or around the storage medium 104. The temperature detection circuit 318 may include an on-chip temperature sensor.

The buffers 320 may be registers, ROM fuses, and/or other storage devices for storing default values such as base voltages and other parameters.

Any one or any combination of control circuitry 310, state machine 312, decoders 314/324/326, temperature detection circuit 318, power control module 316, sense blocks 370, read/write circuits 360, and storage controller 102 can be considered one or more control circuits (or managing circuitry, or peripheral circuitry) that performs the functions described herein.

The memory array 350 may be addressable by word lines via a row decoder 324 and by bit lines via a column decoder 326. The memory array 350 may comprise one or more 2D or 3D arrays of memory cells. The memory array 350 may comprise a monolithic 3D memory array in which multiple memory levels are formed above (and not in) a single substrate, such as a wafer, with no intervening substrates. The memory array 350 may comprise any type of non-volatile memory that is monolithically formed in one or more physical levels of arrays of memory cells having an active area disposed above a silicon substrate. The memory array 350 may be in a non-volatile memory device having circuitry associated with the operation of the memory cells, whether the associated circuitry is above or within the substrate.

Multiple memory elements in memory array 350 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors. In some implementations, the non-volatile memory cells of memory array 350 comprise vertical NAND strings with charge-trapping material. In such a configuration, a NAND string includes memory cells connected by a channel.

A NAND flash memory array 350 may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three-dimensional memory array 350 may be arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three-dimensional memory array 350 may be vertically arranged as a stack of multiple two-dimensional memory device levels. As another non-limiting example, a three-dimensional memory array 350 may be arranged as multiple vertical columns (e.g., columns extending substantially perpendicular to the major surface of the substrate, i.e., in the y direction) with each column having multiple memory cells. The vertical columns may be arranged in a two-dimensional configuration, e.g., in an x-y plane, resulting in a three-dimensional arrangement of memory cells, with memory cells on multiple vertically stacked memory planes. Other configurations of memory elements in three dimensions can also constitute a three-dimensional memory array.

By way of a non-limiting example, in a three-dimensional NAND memory array, the memory elements may be coupled together to form vertical NAND strings that traverse across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

In some implementations, the memory array 350 comprises a two dimensional memory array of non-volatile memory cells. In one example, the non-volatile memory cells are NAND flash memory cells utilize floating gates. Other types of memory cells (e.g., NOR-type flash memory) can also be used.

The exact type of memory array architecture or memory cells included in the memory array 350 is not limited to the examples above. Many different types of memory array architectures or memory cell technologies can be used to form the memory array 350. No particular non-volatile memory technology is required for purposes of the implementations described herein. Other examples of suitable technologies for memory cells of the memory array 350 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of the memory array 350 include two dimensional arrays, three dimensional arrays, cross-point arrays, stacked two dimensional arrays, vertical bit line arrays, and the like.

A person of ordinary skill in the art will recognize that the technology described herein is not limited to a single specific memory array, but covers many relevant memory arrays within the spirit and scope of the technology as described herein and as understood by one of ordinary skill in the art.

Figure 4:
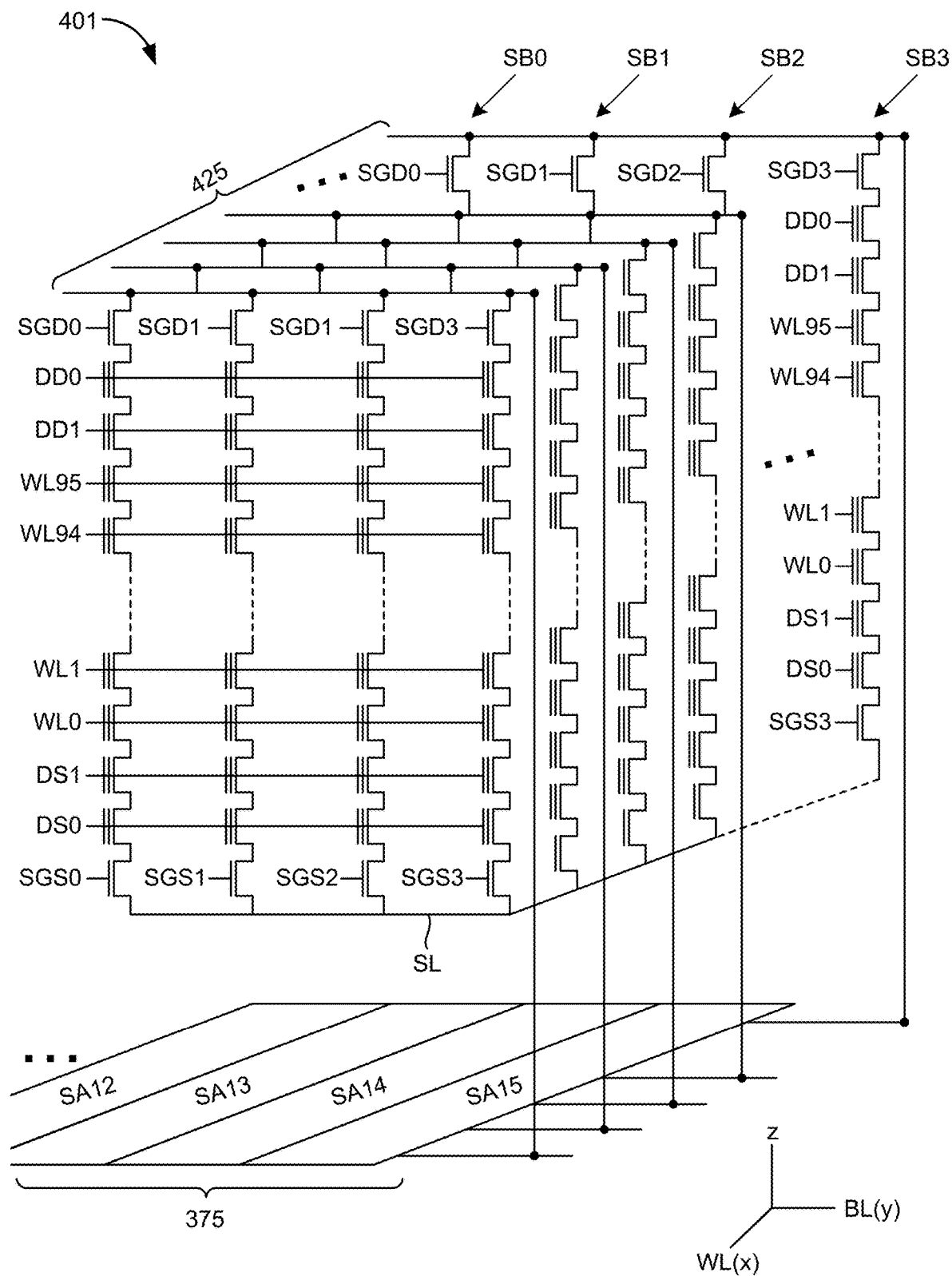
FIG. 4 is a schematic of a plurality of NAND strings in accordance with some implementations.

FIG. 4 is a schematic diagram of a portion of the memory array 350 depicted in FIG. 3. FIG. 4 shows physical word lines WL0-WL95 running across the entire block. Within the block, each bit line 425 is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Each bit line 425 is connected to sense amplifiers in the peripheral circuitry of the storage medium 104 (e.g., in sense blocks 370 of the read/write circuits 360). The sense amplifiers sense voltage signals associated with selected memory cells of the respective NAND strings corresponding to each bit line (e.g., determining whether a given memory cell is conducting current during a sense operation, or how much current the given memory cell conducts during the sense operation). The sense amplifiers then amplify the sensed voltages to levels that are optimized for the I/O circuitry of the storage medium 104, interface channel 114, and storage controller 102.

Memory cells in the various implementations of the memory array 350 described above can be erased, programmed, and read. At the end of a successful programming process (with verification), the threshold voltages of the memory cells should be within one or more distributions (ranges) of threshold voltages for programmed memory cells or within a distribution (range) of threshold voltages for erased memory cells, as appropriate.

Figure 5:
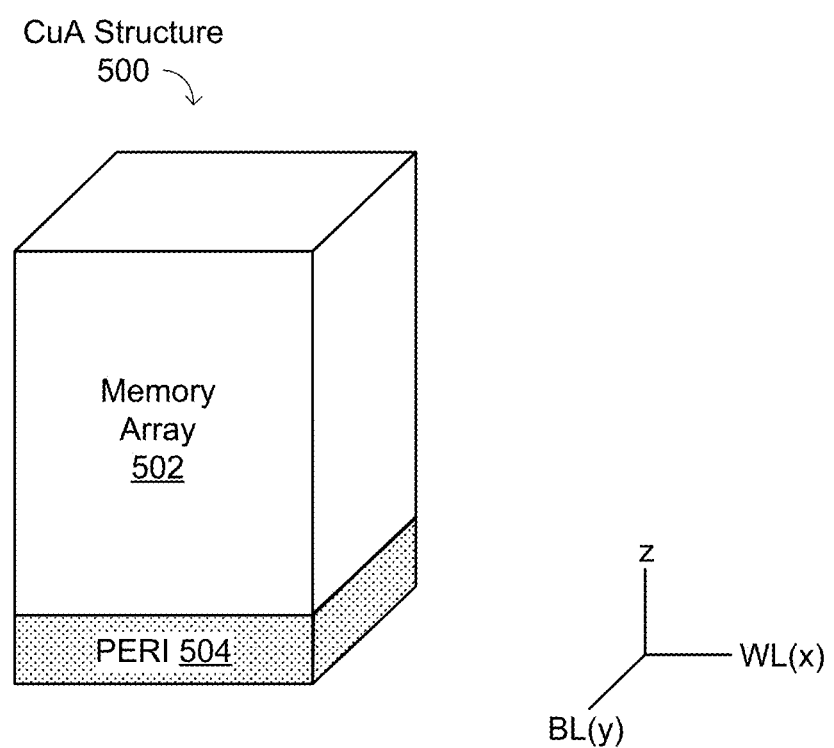
FIG. 5 illustrates example threshold voltage distributions (ranges) for TLC memory cells that store three bits of data in accordance with some implementations.

FIG. 5 is a perspective view of a CMOS under array (CuA) memory structure 500 in accordance with some implementations. CuA structure 500 includes a memory array 502 and peripheral circuitry 504.

Memory array 502 corresponds to the three-dimensional memory array 350 described above with reference to FIGS. 3 and 4. In one example implementation, the length of the plane in the x-direction represents a direction in which signal paths for word lines extend (a word line or SGD line direction), and the width of the plane in the y-direction, represents a direction in which signal paths for bit lines extend (a bit line direction). The z-direction represents a height of the storage device.

Peripheral circuitry 504 corresponds to any one or any combination of control circuitry 310, state machine 312, decoders 314/324/326, temperature detection circuit 318, power control module 316, sense blocks 370, read/write circuits 360, and storage controller 102 described above with reference to FIGS. 1-4. For example, peripheral circuitry 504 may include voltage regulators, charge pumps, page buffers, sense amplifiers, logic circuits, redundancy structures, level shifters, and so forth.

In some implementations, peripheral circuitry 504 is implemented underneath the vertical stack of memory cells in memory array 502. Implementing the peripheral circuitry 502 underneath the memory 502 saves die space (allowing more die space to be used for memory cells) and increases the amount of space available for peripheral circuitry.

Figure 6:
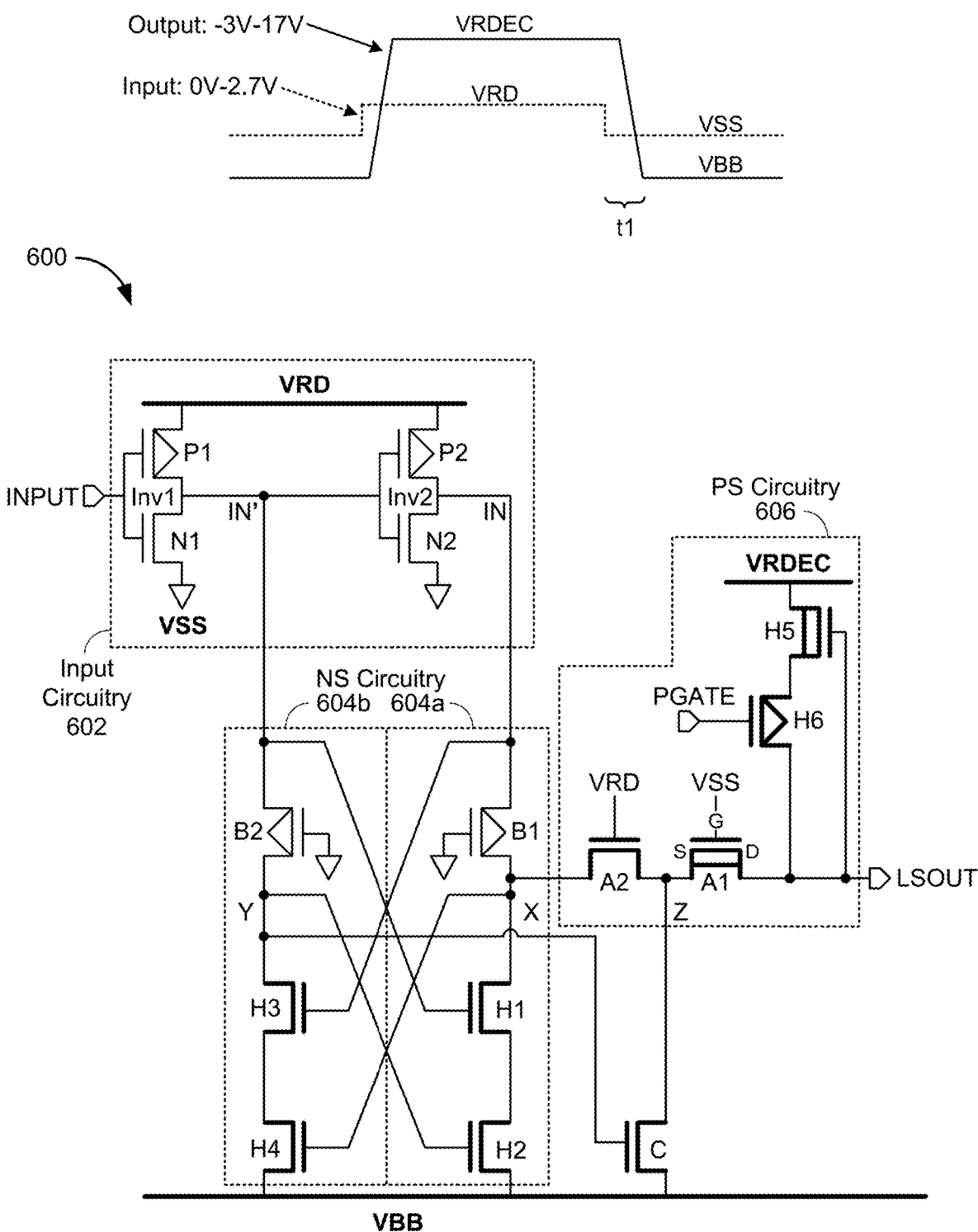
FIG. 6 is a circuit diagram of a level shifter in accordance with some implementations.

FIG. 6 is a circuit diagram of a level shifter 600 in accordance with some implementations. Level shifter 600 (also referred to as level shifting circuitry) may be implemented in the peripheral circuitry 504 of a CuA structure 500 (FIG. 5), and may be included in or otherwise coupled to control circuitry 310, read-write circuits 360, row decoder 324, and/or column decoder 326 of a storage medium 104 (FIG. 3). In some implementations, level shifter 600 may be used in low-standby-power (LSTP) CMOS applications. In such cases, level shifter 600 would be referred to as an LSTP level shifter.

Level shifters find many applications in integrated circuits when there is a need to provide a particular voltage at a given node in response to an enable signal. For example, level shifters frequently occur as part of the peripheral circuitry (504, FIG. 5) on non-volatile memory devices where they may need to supply some of the fairly high voltage levels, such as in the 10-30 volt range, used in such devices.

For some designs of non-volatile memories, as well as in level shifter applications, there is also a need to drive a negative voltage. In such a situation, the level shifter needs to be able to realize a large voltage positive level and a negative level (e.g., for word line decoding). Such a level shifter must be a high voltage level shifter (e.g., for selected word lines) and also a negative voltage level shifter (e.g., for unselected memory blocks). For example, when enabled for a selected block of memory cells, the level shifter can drive a positive high voltage level to word line decode transistors.

The level shifter 600 receives logic level signals as input and converts them to large-swing signals as output. An example input signal may include a high level (VRD) such as 2.7V (or higher or lower) and a low level (VSS) such as 0V (or higher or lower). An example output signal may include a high level (VRDEC) such as 17V (or higher or lower) and a low level (VBB) such as −3V (or higher or lower).

The level shifter 600 includes input circuitry 602 configured to receive high level and low level input signals, negative shifting (NS) circuitry 604a/604b configured to pull the low level input signals down to negative output signals, and positive shifting (PS) circuitry 606 configured to pull the high level input signals up to positive amplified output signals.

The input circuitry 602 receives an input signal (e.g., between 0V and 2.7V) and inverts the input signal twice, using a first inverter Inv1 (including an NMOS N1 and a PMOS P1 connected in series between VRD and VSS) and a second inverter Inv2 (including an NMOS N2 and a PMOS P2 connected in series between VRD and VSS). The input circuitry 602 provides an inverted version of the input signal IN' and a non-inverted (or twice inverted) version of the input signal IN to the NS circuitry 604a/604b.

The NS circuitry 604a/604b pulls the low input signal VSS down to VBB (e.g., from 0V down to −3V). The NS circuitry 604a/604b includes two legs (also referred to as sub-circuits), including a first leg 604a and a second leg 604b. The first leg 604a receives the double-inverted input signal IN from the first inverter Inv1 of the input circuitry 602, and the second leg 604b receives the inverted input signal IN' from the second inverter Inv2 of the input circuitry 602.

The first leg 604a of the NS circuitry includes a PMOS B1, an NMOS H1, and an NMOS H2 connected in series between IN (sometimes referred to as a first input node) and VBB, and the second leg 604b of the NS circuitry includes a PMOS B2, an NMOS H3, and an NMOS H4 connected in series between IN' (sometimes referred to as a second input node) and VBB.

The NMOS devices H1-H4 may be implemented as high voltage NMOS transistors with triple well process and positive Vt. All bulk levels (not shown) of the HV NMOS devices may be connected to VBB or a negative bias to prevent forward bias at PN junctions. The HN wells (not shown) may be connected to VRD or a positive bias.

The gates of the NMOS devices in each leg are connected to intermediate nodes of the other leg (referred to as cross-coupled). Specifically, the gate of H1 is connected to the IN' node of the second leg 604b, the gate of H2 is connected to node Y of the second leg 604b (sometimes referred to as a second intermediate node), the gate of H3 is connected to the IN node of the first leg 604a, and the gate of H4 is connected to node X of the first leg 604a (sometimes referred to as a first intermediate node).

The PMOS devices B1 and B2 may be implemented as low voltage PMOS transistors with their LV n-well connected to the same high supply level as the other PMOS devices to minimize decoding area. In alternate implementations, the single PMOS devices B1 and B2 can each be replaced with two or more PMOS devices connected is series.

The source side of PMOS B1 is connected to IN, and the source side of PMOS B2 is connected to IN', while gates of both B1 and B2 are connected to the low level VSS to prevent thin oxide break down. The gates of the PMOS devices B1 and B2 are set to ground.

The PMOS devices B1 and B2 can be thin oxide devices having small channel length and width for switching speed and requiring relatively small drawing layout area. Low voltage devices are typically used as logic gates in peripheral circuitry.

An advantage of being able to use such low voltage devices here is that this arrangement allows the circuit to connect the n-well of these PMOS devices to VRD, the same as other low voltage PMOS transistors in the design, so that they can share the same n-well layout while their drain-source voltage (VDS) does not exceed the maximum VDS allowance of low voltage transistors.

In a typical application, such as on a non-volatile memory device, the circuit can have many thousands of such blocks on the chip, and this design is repeated a corresponding number of times. As H6 needs its own HV n-well, it would be a large layout area penalty if the circuit also needed to use HV PMOS devices B1 and B2, or additional devices with different n-wells.

The PS circuitry 606 pulls the high input signal VRD up to VRDEC (e.g., from 2.7V up to 17V). The PS circuitry 606 includes a depletion type NMOS H5 connected in series with a PMOS H6 between the high voltage signal VRDEC (here a decoding voltage) and the output node LSOUT. Both H5 and H6 are configured to handle the high VRDEC voltage. The gate of H5 is connected to the output node LSOUT, and the gate of H6 receives signal PGATE.

The PS circuitry 606 transfers a high voltage from a charge pump (not shown) to other elements of the storage medium 104 (e.g., word line decoding elements). For example, when a memory block is selected, the high voltage (VRDEC) may be passed through the series connected high voltage NMOS H5 and the high voltage PMOS H6 devices to control the gates of high voltage NMOS switches (not shown) for word line decoding.

The PS circuitry 606 includes NMOS devices A1 and A2 in series with the output node LSOUT and node X of the first leg 604a of the NS circuitry. H5, A1, and A2 may be high voltage NMOS devices with triple well and negative Vt. In addition, an NMOS device C is connected via its drain and source to node Z (between A1 and A2) and VBB. The gate of NMOS device C is connected to node Y of the second leg 604b of the NS circuitry.

The voltage at node X (of NS circuitry 604a) is supplied to the PS circuitry 606 via NMOS devices A1 and A2. Under this arrangement, the output node LSOUT can either be at the high voltage supplied at VRDEC or at the negative level VBB.

Node X may be referred to as a first intermediate node (or an output node) of the NS circuitry 604a/604b, conveying a signal to the PS circuitry 606. Node X is fully charged to VRD when INPUT is high, and charged down to VBB when INPUT is low. When node X is high, H3 and H4 are on, causing H1 and H2 to turn off. When node X is low, H3 and H4 are off, causing H1 and H2 to turn on due to the high voltage at the IN' node.

Node Y may be referred to as a second intermediate node of the NS circuitry 604a/604b, conveying a signal to the gate of NMOS device C.

Figure 7:
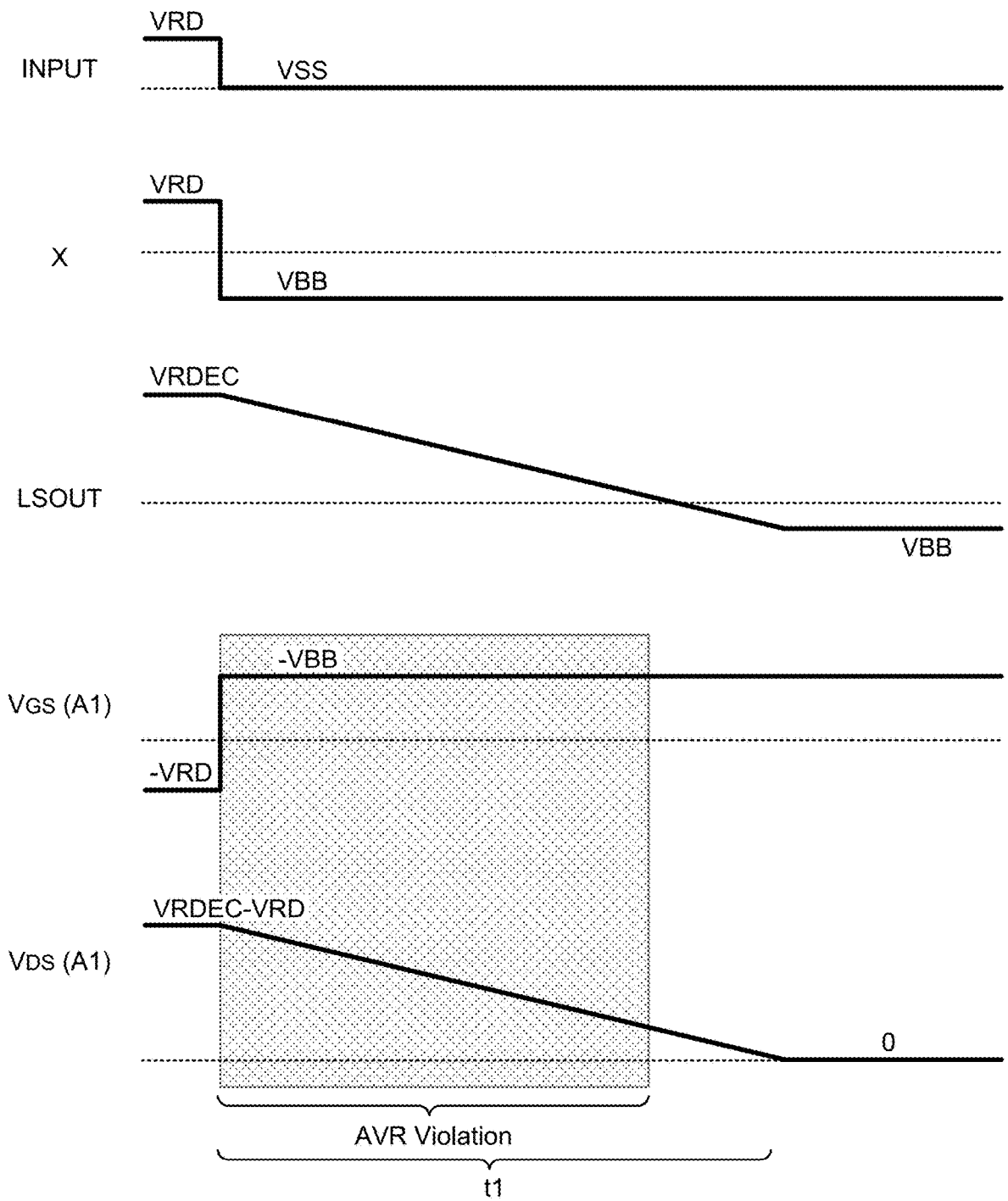
FIG. 7 depicts timing diagrams of various nodes of the level shifter circuitry in FIG. 6 in accordance with some implementations.

FIG. 7 depicts timing diagrams of various nodes of the level shifter circuitry 600 in accordance with some implementations. The operation of the level shifter circuitry 600 will now be described with reference to FIGS. 6 and 7.

When the input signal (INPUT) is high (VRD), the first inverter Inv1 inverts the input signal to low (VSS) at node IN', and the second inverter Inv2 inverts the low signal at node IN' to high (VRD) at node IN. The low signal at node IN' turns off NMOS devices H1 and H2, causing node X to float.

The high signal at node IN turns on NMOS devices H3 and H4, connecting node Y to VBB, which causes NMOS device C and PMOS devices H1 and H2 to turn off. The high signal at node IN also causes node X to go high (to VRD), and pass the high signal to the PS circuitry 606 via NMOS devices A2 and A1. The high signal (VRD) at the output node LSOUT causes NMOS device H5 to turn on, charging up the output node LSOUT to the higher voltage VRDEC.

When the input signal (INPUT) flips to low (VSS) (at the beginning of time interval t1, FIG. 7), the first inverter Inv1 inverts the input signal to high (VRD) at node IN', and the second inverter inverts the high signal at node IN' to low (VSS) at node IN. The high signal at node IN' turns on NMOS devices H1 and H2, causing node X to be pulled down to VBB, and pass VBB to the PS circuitry 606. The high signal at node IN' causes node Y to go high, which turns on NMOS device C, thereby pulling node Z down to VBB.

The low signal at node IN turns off NMOS devices H3 and H4, causing node Y to float (staying at VRD), causing NMOS device C to pull down node Z to VBB. The output node LSOUT discharges from VRDEC to VBB over the course of a discharge interval t1 (FIG. 7).

As NAND memory technology continues to advance, future generations require VBB to be more negative (e.g., beyond −3V, such as −3.5V, −4V, or even more negative). The level shifter 600 may not allow for a further negative VBB for a number of reasons.

First, at the time of discharge (at the beginning of interval t1, FIG. 7), A1 may suffer an acceptable voltage range (AVR) violation due to having a large drain-to-source voltage VDS and a large gate-to-source voltage VGS at the same time. Such an AVR could cause A1 to fail.

Second, the level shifter 600 may not flip correctly, or may flip very slowly, because transistor C may receive a higher VGS, which causes C to be more strongly on (conducting more current) compared to B1 and P2. This causes contention between C and B1/P2.

Figure 8:
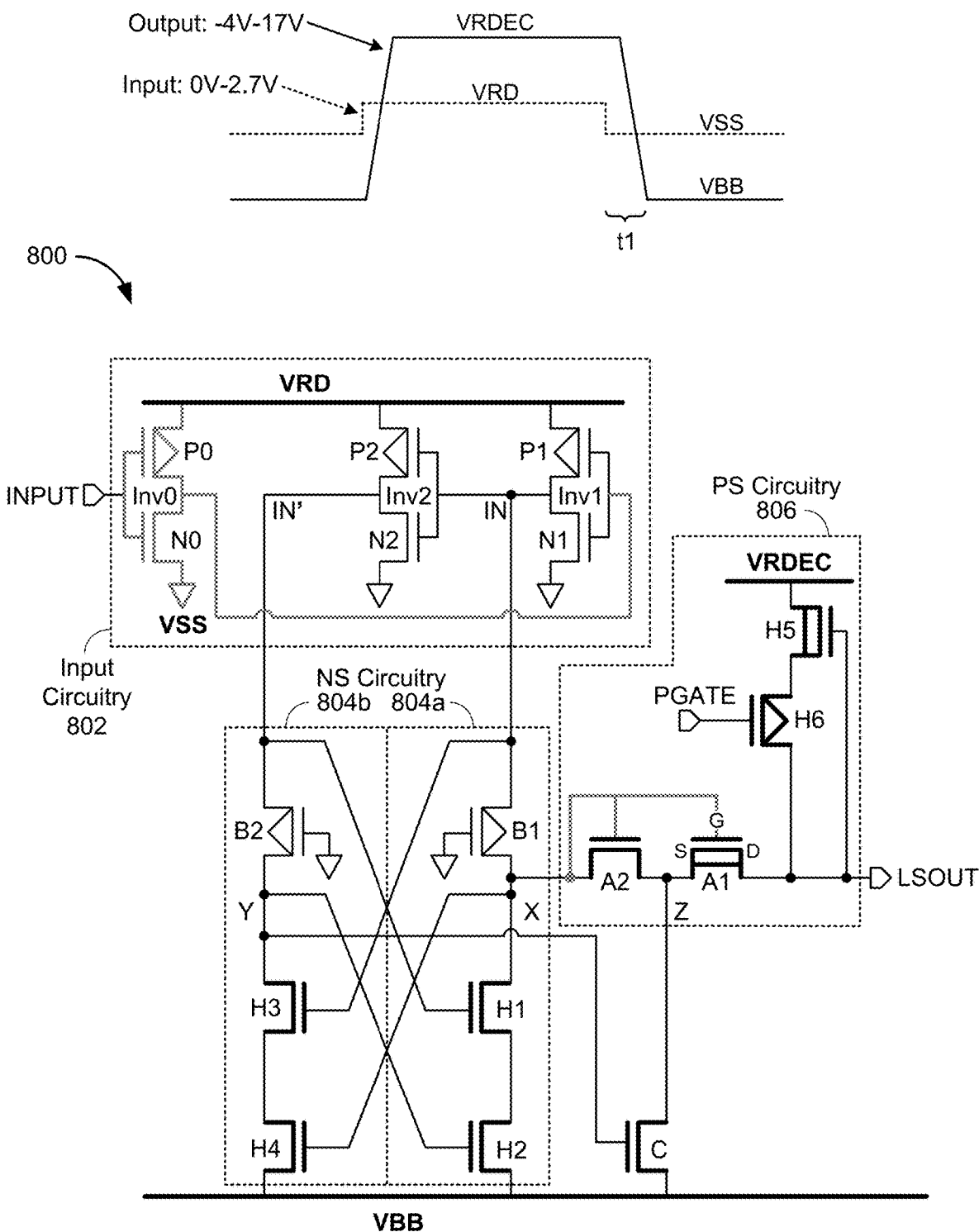
FIG. 8 is a circuit diagram of a level shifter in accordance with some implementations.

FIG. 8 is a circuit diagram of a level shifter 800 in accordance with some implementations. Level shifter 800 (also referred to as level shifting circuitry) may be implemented in the peripheral circuitry 504 of a CuA structure 500 (FIG. 5), and may be included in or otherwise coupled to control circuitry 310, read-write circuits 360, row decoder 324, and/or column decoder 326 of a storage medium 104 (FIG. 3). In some implementations, level shifter 600 may be used in low-standby-power (LSTP) CMOS applications. In such cases, level shifter 800 would be referred to as an LSTP level shifter.

The architecture of level shifter 800 solves the AVR and contention issues introduced above (with reference to level shifter 600) without significant area increase or impact since there is no change in the number of high voltage transistors. The level shifter 800 avoids AVR violations in A1 by connecting the gate of A1 to node X. In addition, the level shifter 800 mitigates contention between C and B1/P2 by reversing the flow of the input signal, thereby resulting in faster flipping of the output signal LSOUT. These solutions are discussed in more detail below with reference to FIGS. 7, 9, and 10. First, however, a detailed description of the level shifter 800 follows.

Similar to level shifter 600 (FIG. 6), level shifter 800 (FIG. 8) receives logic level signals as input and converts them to large-swing signals as output. An example input signal may include a high level (VRD) such as 2.7V (or higher or lower) and a low level (VSS) such as 0V (or higher or lower). An example output signal may include a high level (VRDEC) such as 17V (or higher or lower) and a low level (VBB) such as −4V (or higher or lower).

The level shifter 800 includes input circuitry 802 configured to receive high level and low level input signals, negative shifting (NS) circuitry 804a/804b configured to pull the low level input signals down to negative output signals, and positive shifting (PS) circuitry 806 configured to pull the high level input signals up to positive amplified output signals.

The input circuitry 802 receives an input signal (e.g., between 0V and 2.7V) and inverts the input signal three times, using an input inverter Inv0 (including an NMOS N0 and a PMOS P0 connected in series between VRD and VSS), a first inverter Inv1 (including an NMOS N1 and a PMOS P1 connected in series between VRD and VSS), and a second inverter Inv2 (including an NMOS N2 and a PMOS P2 connected in series between VRD and VSS). The input circuitry 802 provides a double-inverted version of the input signal IN and a triple-inverted version of the input signal IN' to the NS circuitry 804a/804b.

The NS circuitry 804a/804b pulls the low input signal VSS down to VBB (e.g., from 0V down to −4V). The NS circuitry 804a/804b includes two legs (also referred to as sub-circuits), including a first leg 804a and a second leg 804b. The first leg 804a receives the double-inverted input signal IN from the first inverter Inv1 of the input circuitry 802, and the second leg 604b receives the triple inverted input signal IN' from the second inverter Inv2 of the input circuitry 802.

The first leg 804a of the NS circuitry includes a PMOS B1, an NMOS H1, and an NMOS H2 connected in series between IN (sometimes referred to as a first input node) and VBB, and the second leg 804b of the NS circuitry includes a PMOS B2, an NMOS H3, and an NMOS H4 connected in series between IN' (sometimes referred to as a second input node) and VBB.

The NMOS devices H1-H4 may be implemented as high voltage NMOS transistors with triple well process and positive Vt. All bulk levels (not shown) of the HV NMOS devices may be connected to VBB or a negative bias to prevent forward bias at PN junctions. The HN wells (not shown) may be connected to VRD or a positive bias.

The gates of the NMOS devices in each leg are connected to intermediate nodes of the other leg (referred to as cross-coupled). Specifically, the gate of H1 is connected to the IN' node of the second leg 804b, the gate of H2 is connected to node Y of the second leg 804b, the gate of H3 is connected to the IN node of the first leg 804a, and the gate of H4 is connected to node X of the first leg 804a.

The PMOS devices B1 and B2 may be implemented as low voltage PMOS transistors with their LV n-well connected to the same high supply level as the other PMOS devices to minimize decoding area. In alternate implementations, the single PMOS devices B1 and B2 can each be replaced with two or more PMOS devices connected in series.

The source side of PMOS B1 is connected to IN, and the source side of PMOS B2 is connected to IN', while gates of both B1 and B2 are connected to the low level VSS to prevent thin oxide break down. The gates of the PMOS devices B1 and B2 are set to ground.

The PMOS devices B1 and B2 can be thin oxide devices having small channel length and width for switching speed and requiring relatively small drawing layout area. Low voltage devices are typically used as logic gates in peripheral circuitry.

An advantage of being able to use such low voltage devices here is that this arrangement allows the circuit to connect the n-well of these PMOS devices to VRD, the same as other low voltage PMOS transistors in the design, so that they can share the same n-well layout while their drain-source voltage (VDS) does not exceed the maximum VDS allowance of low voltage transistors.

In a typical application, such as on a non-volatile memory device, the circuit can have many thousands of such blocks on the chip, and this design is repeated a corresponding number of times. As H6 needs its own HV n-well, it would be a large layout area penalty if the circuit also needed to use HV PMOS devices B1 and B2, or additional devices with different n-wells.

The PS circuitry 806 pulls the high input signal VRD up to VRDEC (e.g., from 2.7V up to 17V). The PS circuitry 806 includes a depletion type NMOS H5 connected in series with a PMOS H6 between the high voltage signal VRDEC (here a decoding voltage) and the output node LSOUT. Both H5 and H6 are configured to handle the high VRDEC voltage. The gate of H5 is connected to the output node LSOUT, and the gate of H6 receives signal PGATE.

The PS circuitry 806 transfers a high voltage from a charge pump (not shown) to other elements of the storage medium 104 (e.g., word line decoding elements). For example, when a memory block is selected, the high voltage (VRDEC) may be passed through the series connected high voltage NMOS H5 and the high voltage PMOS H6 devices to control the gates of high voltage NMOS switches (not shown) for word line decoding.

The PS circuitry 806 includes NMOS devices A1 and A2 in series with the output node LSOUT and node X of the first leg 804a of the NS circuitry. H5, A1, and A2 may be high voltage NMOS devices with triple well and negative Vt. In addition, an NMOS device C is connected via its drain and source to node Z (between A1 and A2) and VBB. The gate of NMOS device C is connected to node Y of the second leg 804b of the NS circuitry.

The voltage at node X (of NS circuitry 804a) is supplied to the PS circuitry 806 via NMOS devices A1 and A2. Under this arrangement, the output node LSOUT can either be at the high voltage supplied at VRDEC or at the negative level VBB.

Node X may be referred to as a first intermediate node (or an output node) of the NS circuitry 804a/804b, conveying a signal to the PS circuitry 806. Node X is fully charged to VRD when INPUT is high, and charged down to VBB when INPUT is low. When node X is high, H3 and H4 are on, causing H1 and H2 to turn off. When node X is low, H3 and H4 are off, causing H1 and H2 to turn on due to the high voltage at the IN' node.

Node Y may be referred to as a second intermediate node of the NS circuitry 804a/804b, conveying a signal to the gate of NMOS device C.

Figure 9:
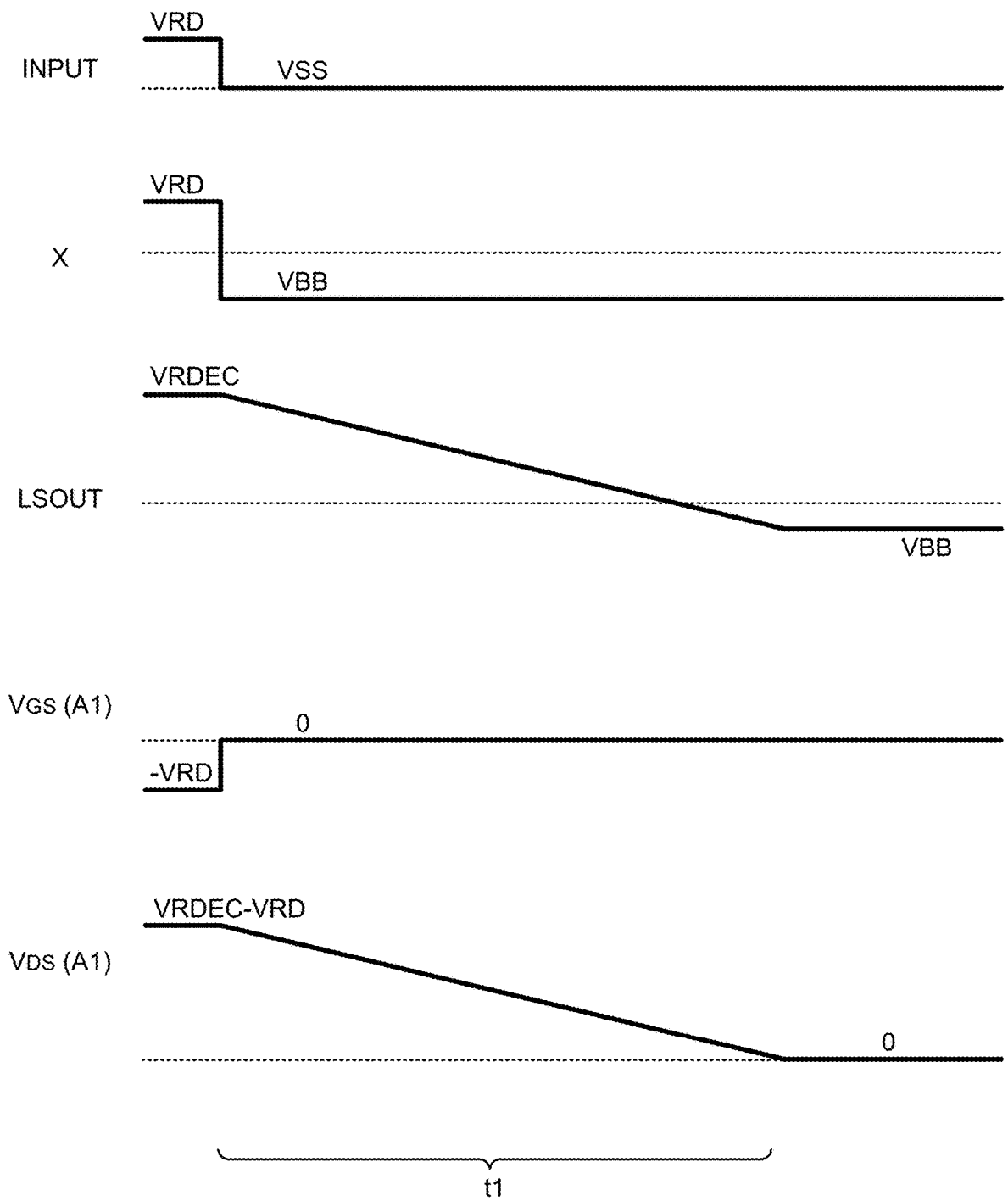
FIG. 9 depicts timing diagrams of various nodes of the level shifter circuitry in FIG. 8 in accordance with some implementations.

FIG. 9 depicts timing diagrams of various nodes of the level shifter circuitry 800 in accordance with some implementations. The operation of the level shifter circuitry 800 will now be described with reference to FIGS. 8 and 9.

When the input signal (INPUT) is high (VRD), the input inverter Inv0 inverts the input signal to low (VSS), and provides the low signal to the first inverter Inv1, which inverts it to high (VRD) at node IN. The second inverter Inv2 inverts the high signal at node IN to low (VSS) at node IN'. The low signal at node IN' turns off NMOS devices H1 and H2, causing node X to float.

Compared to the operation of level shifter 600 (FIGS. 6-7), in which the input signal is configured to flow from left (node IN') to right (node IN), level shifter 800 routes the input signal from right (node IN) to left (node IN') by adding an additional inverter Inv0 and switching the direction of the first and second inverters Inv1 and Inv2. As a result, nodes IN and IN' in level shifter 800 reach the same levels in response to a given input signal (when compared to the corresponding nodes in level shifter 600), but the order in which these nodes reach the corresponding levels is reversed.

Specifically, in level shifter 600, the second leg 604b is configured to receive voltage from node IN' before the first leg 604a receives voltage from node IN. In level shifter 800, however, the first leg 804a is configured to receive voltage from node IN before the second leg 804b receives voltage from node IN' (the reason for this reversal is described in more detail below with reference to FIGS. 10A-10B).

The high signal at node IN turns on NMOS devices H3 and H4, connecting node Y to VBB, which causes NMOS device C and PMOS devices H1 and H2 to turn off. The high signal at node IN also causes node X to go high (to VRD), and pass the high signal to the PS circuitry 806 via NMOS devices A2 and A1. The high signal (VRD) at the output node LSOUT causes NMOS device H5 to turn on, charging up the output node LSOUT to the higher voltage VRDEC.

When the input signal (INPUT) flips to low (VSS) (at the beginning of time interval t1, FIG. 9), the input inverter inverts the low signal to high (VRD), the first inverter Inv1 inverts the high signal to low (VSS) at node IN, and the second inverter inverts the low signal at node IN to high (VRD) at node IN'. The high signal at node IN' turns on NMOS devices H1 and H2, causing node X to be pulled down to VBB, and pass VBB to the PS circuitry 806. The high signal at node IN' causes node Y to go high, which turns on NMOS device C, thereby pulling node Z down to VBB.

The low signal at node IN turns off NMOS devices H3 and H4, causing node Y to float (staying at VRD), causing NMOS device C to pull down node Z to VBB. The output node LSOUT discharges from VRDEC to VBB over the course of a discharge interval t1 (FIG. 9).

One notable difference between the configurations of level shifters 600 and 800 includes the gate connection of NMOS device A1. In level shifter 600, the gate of A1 is connected to VSS (0V). Referring to FIG. 7, at the beginning of a discharge (interval t1), both VGS and VDS of A1 are large, causing an AVR violation. An AVR violation occurs when VGS and VDS are large at the same time. As a nonlimiting example, while VDS of A1 may allow for high voltages (e.g., 20V), VGS must be lower than a threshold (e.g., 1V) when VDS is higher than a threshold (e.g., 6V). In other words, when VDS is large, a large VGS should not be applied at the same time.

When the input flips from high to low (beginning of interval t1), LSOUT must also flip from high to low (e.g., from 17V to −4V). At the beginning of this transition, C is responsible for pulling down LSOUT to VBB.

If the gate of A1 is connected to VSS (as in level shifter 600), this results in application of a high voltage (at A1) at the beginning of discharge for both VGS and VDS. Specifically, VGS is equal to VSS−VBB=−VBB, and VDS is initially equal to VRDEC−VRD. Using the example numbers above, since VDS is greater than 6V, VGS must be less than 1V to avoid an AVR violation. However, in this example, VGS is equal to as much as 4V.

If the gate of A1 is connected to node X, on the other hand (FIG. 8), this results in a voltage of 0V at the beginning of discharge for VGS (FIG. 9). Since node X flips to VBB at the beginning of the discharge, the gate of A1 flips to VBB, and the resulting VGS is equal to VBB−VBB=0V. The VGS of A1 does not go as high as −VBB, but remains around 0V or less. As a result, although VDS is large, VGS is small, thereby avoiding an AVR violation during interval t1 (FIG. 9).

Figure 10A:
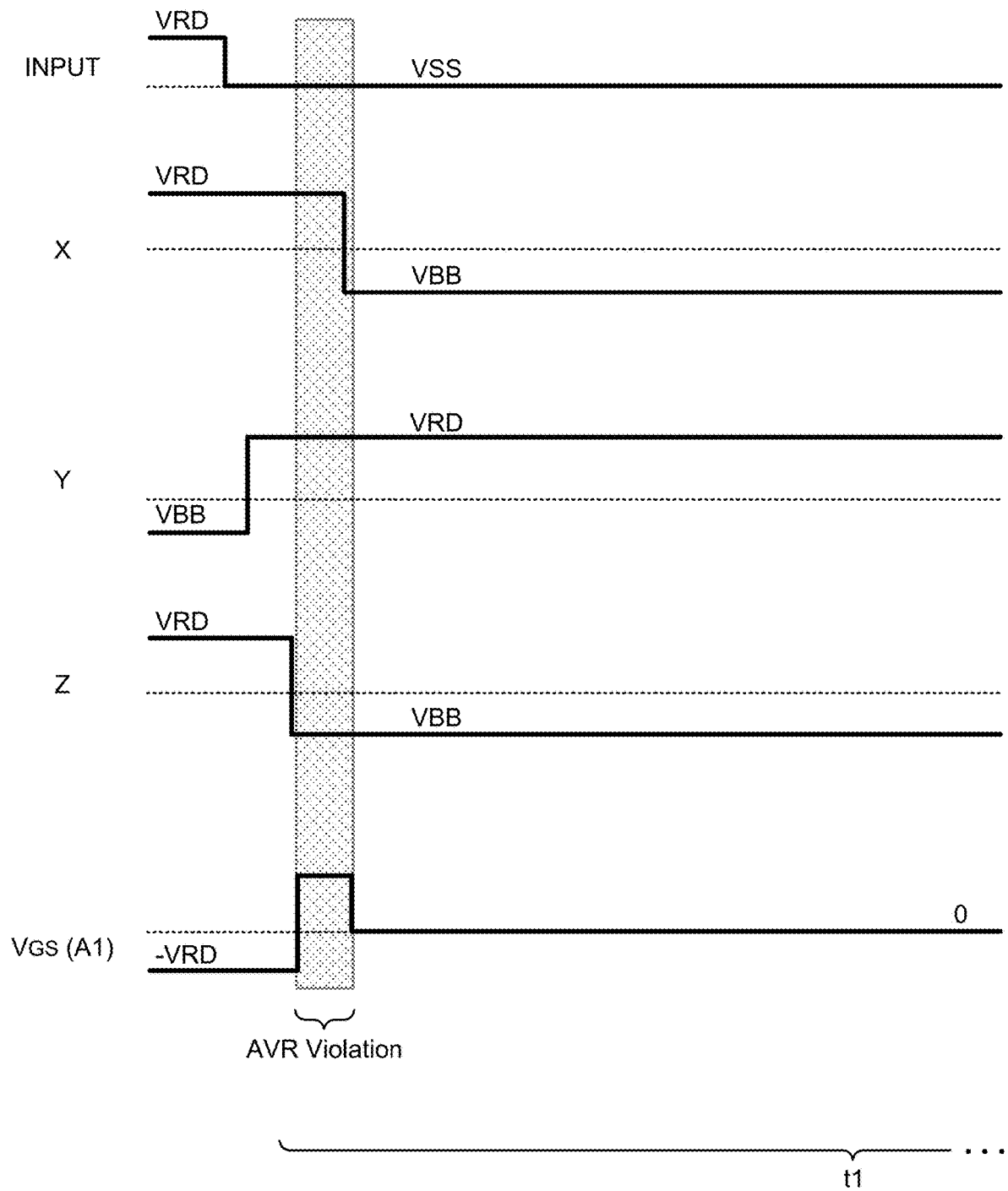
FIGS. 10A-10B depict timing diagrams of various nodes of the level shifter circuitry in FIGS. 6 and 8, respectively, in accordance with some implementations.
Figure 10B:
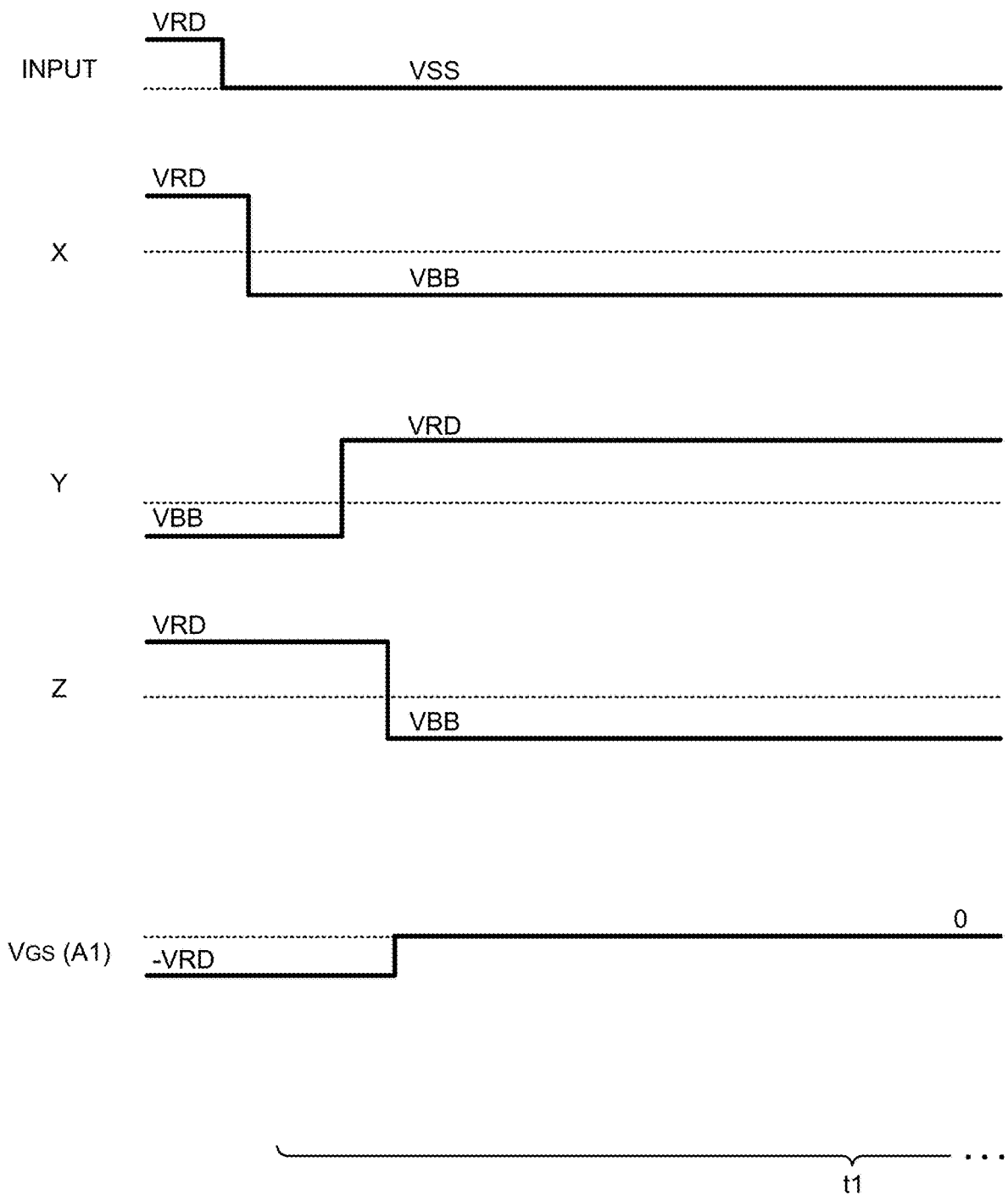

FIGS. 10A-10B depict timing diagrams of various nodes of the level shifter circuitry 600 and 800, respectively, in accordance with some implementations. While connecting the gate of A1 to node X may avoid AVR violations of A1 during interval t1 (FIG. 9), the initial transition to interval t1 may still result in a brief AVR violation depending on the timing of transitions at nodes X and Y.

Specifically, at the beginning of the transition from high to low at the input (from VRD to VSS, at the beginning of interval t1), if node Y goes high (to VRD) before node X goes low (to VBB), NMOS C may turn on prematurely and pull down node Z to low voltage (VBB). As a result, high voltage at the gate of A1 (due to node X being high) and low voltage at the source of A1 (due to node Z being low) causes a large VGS of A1, resulting in a brief AVR violation, as depicted in FIG. 10A.

Changing the direction of flow of the input signal (as depicted in FIG. 8) ensures that node X goes down before node Y goes up, as depicted in FIG. 10B, thereby avoiding the brief AVR violation described above. Specifically, the direction of flow of the input signal in the level shifter 800 causes node IN (and by extension, node X) to receive a low signal before node IN' (and by extension, node Y) receives a high signal. Therefore, node X goes down before node Y goes up, which prevents VGS of A1 from being larger than around 0V during interval t1, thereby avoiding an AVR violation.

The discussion above covered various scenarios in which increasingly negative output voltages (VBB) may cause AVR violations in a level shifter, and how such AVR violations may be avoided using the architecture depicted in FIG. 8. The following discussion covers various scenarios in which an increasingly negative output voltages (VBB) may cause contention between transistor A2, on one hand, and B1 and P1 on the other.

Referring to FIG. 6, the level shifter 600 may not flip correctly, or may flip very slowly, because transistor C may receive a higher VGS, which causes transistor C to be more strongly on (conducting more current) compared to B1 and P2. This causes contention between C and B1/P2.

Specifically, for node X to flip from low to high quickly, the on-current of B1 and P2 (the current between their respective drains and sources) needs to be sufficiently higher than the on-current of C. However, an increasingly negative VBB (e.g., −4V vs. −3V) causes the on-current of C to increase, which causes C and B1/P2 to have comparable on-currents, which results in contention between C and B1/P2. This contention causes the voltage at node X to flip from low to high slowly, or to fail to flip.

Stated another way, when the input is low (VSS), node Y is high, node X is low, and C is on. When the input flips to high (VRD), node Y must go low, and node X must go high. Initially, node C is on, and because the input flipped to high, B1 and P2 also turn on. This causes a temporary direct current from VRD to VBB, which can cause malfunctions in the level shifter 600 and in other elements of the storage system 100.

For node X to successfully flip from low to high, B1 and P2 must be stronger (having a higher on-current) than C. If that is the case, node X goes sufficiently high enough to turn on H3 and H4, which causes node Y to go down, which causes transistor C to turn off.

If B1 and P2 are not stronger (do not have a higher on-current) than C, an increased VGS must be applied to B1 to ensure it flips despite C's on-current. However, applying a larger VGS to B1 causes VDS of B1 to also increase, which causes an AVR violation. To avoid this type of an AVR violation, the contention between C and B1/P2 must be addressed.

The solution to the aforementioned contention issue includes connecting the gate of A2 to node X (see FIG. 8). When node X flips from low to high, C is initially disconnected from node X (while node X is still low). As a result, B1 no longer has to contend with C. Instead, B1 only has to contend with H1 and H2, which are much weaker than C. As a result, the aforementioned contention issues are reduced, improving overall performance of the level shifter 800.

It will be appreciated by those skilled in the art that changes could be made to the exemplary embodiments shown and described above without departing from the broad inventive concept thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention, different components as opposed to those specifically mentioned may perform at least some of the features described herein, and features of the disclosed embodiments may be combined. As used herein, the terms "about" and "approximately" may refer to + or −10% of the value referenced. For example, "about 9" is understood to encompass 8.2 and 9.9.

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

It will be understood that, although the terms "first," "second," etc. are sometimes used herein to describe various elements, these elements should not be limited by these terms. These terms are only used to distinguish one element from another. For example, a first element could be termed a second element, and, similarly, a second element could be termed a first element, without changing the meaning of the description, so long as all occurrences of the "first element" are renamed consistently and all occurrences of the second element are renamed consistently. The first element and the second element are both elements, but they are not the same element.

As used herein, the term "if" may be, optionally, construed to mean "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, operations, elements, and/or components, but do not preclude the presence or addition of one or more other features, integers, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

Further, to the extent that the method does not rely on the particular order of steps set forth herein, the particular order of the steps should not be construed as limitation on the claims. The claims directed to the method of the present invention should not be limited to the performance of their steps in the order written, and one skilled in the art can readily appreciate that the steps may be varied and still remain within the spirit and scope of the present invention.

What is claimed is:

1. A level shifting circuit, comprising:
    negative voltage shifting circuitry including a first leg and a second leg, wherein:
        the first leg includes a first plurality of NMOS transistors in series with a first input node and a negative amplified voltage; and
        the second leg includes a second plurality of NMOS transistors in series with a second input node and the negative amplified voltage;
    positive voltage shifting circuitry including:
        a first plurality of high voltage transistors in series with a positive amplified voltage and an output node of the level shifting circuit; and
        a second plurality of high voltage transistors in series with a first intermediate node of the first leg of the negative voltage shifting circuitry and the output node of the level shifting circuit; and
    input circuitry including a plurality of inverters, each including a PMOS transistor and an NMOS transistor in series with a positive supply voltage and a negative or zero supply voltage, wherein:
        a first inverter of the plurality of inverters inverts an input signal of the level shifting circuit and outputs a first inverted input signal;
        a second inverter of the plurality of inverters inverts the first inverted input signal and outputs a second inverted input signal to the first leg of the negative voltage shifting circuitry; and
        a third inverter of the plurality of inverters inverts the second inverted input signal and outputs a third inverted input signal to the second leg of the negative voltage shifting circuitry.

2. The level shifting circuit of claim 1, wherein the negative voltage shifting circuitry is configured to:
    provide the negative amplified voltage to the second plurality of high voltage transistors of the positive voltage shifting circuitry via the first intermediate node of the first leg of the negative voltage shifting circuitry when the input signal is the negative or zero supply voltage; and
    provide the second inverted input signal to the second plurality of high voltage transistors of the positive voltage shifting circuitry via the first intermediate node of the first leg of the negative voltage shifting circuitry when the input signal is the positive supply voltage.

3. The level shifting circuit of claim 2, wherein the positive voltage shifting circuitry is configured to:
    provide the negative amplified voltage at the output node of the level shifting circuitry when the first intermediate node of the first leg of the negative voltage shifting circuitry is the negative amplified voltage; and
    provide the positive amplified voltage at the output node of the level shifting circuitry when the first intermediate node of the first leg of the negative voltage shifting circuitry is the positive supply voltage.

4. The level shifting circuit of claim 1, wherein the second plurality of high voltage transistors of the positive voltage shifting circuitry include:
    a first NMOS transistor having a gate connected to the first intermediate node of the first leg of the negative voltage shifting circuitry; and
    a first PMOS transistor having a gate connected to the first intermediate node of the first leg of the negative voltage shifting circuitry.

5. The level shifting circuitry of claim 4, wherein:
    the negative or zero supply voltage is between −0.5V and 0V;
    the negative amplified voltage is between −4.5V and −3.5V;
    the positive supply voltage is between 2V and 3V;
    the positive amplified voltage is between 15V and 20V; and
    a gate-to-source voltage and a drain-to-source voltage of the first PMOS transistor satisfy an acceptable voltage range (AVR) rating of the first PMOS transistor while the output node of the level shifting circuitry switches between the positive amplified voltage and the negative amplified voltage.

6. The level shifting circuitry of claim 4, further comprising a high voltage pull-down transistor connected to the source of the first PMOS transistor and the negative amplified voltage, and configured to be controlled by a second intermediate node of the second leg of the negative voltage shifting circuitry.

7. The level shifting circuitry of claim 1, wherein the input circuitry is configured to output the second inverted input signal to the first leg of the negative voltage shifting circuitry before outputting the third inverted input signal to the second leg of the negative voltage shifting circuitry.

8. The level shifting circuitry of claim 1, wherein:
    the first plurality of NMOS transistors of the negative voltage shifting circuitry include a first NMOS transistor having its gate cross-coupled to the second input node, and a second NMOS transistor having its gate cross-coupled to the second intermediate node; and
    the second plurality of NMOS transistors of the negative voltage shifting circuitry include a first NMOS transistor having its gate cross-coupled to the first input node, and a second NMOS transistor having its gate cross-coupled to the first intermediate node.

9. The level shifting circuitry of claim 1, wherein the positive amplified voltage and the negative amplified voltage are read voltages for a plurality of word lines of a memory array of a data storage device.

10. A method of operating a level shifting circuit, comprising:
operating negative voltage shifting circuitry to down-shift an input signal to a negative amplified voltage, wherein:
a first leg of the negative voltage shifting circuitry includes a first plurality of NMOS transistors in series with a first input node and the negative amplified voltage; and
a second leg of the negative voltage shifting circuitry includes a second plurality of NMOS transistors in series with a second input node and the negative amplified voltage;
operating positive voltage shifting circuitry to up-shift the input signal to a positive amplified voltage, wherein:
a first plurality of high voltage transistors of the positive voltage shifting circuitry are in series with the positive amplified voltage and an output node of the level shifting circuit; and
a second plurality of high voltage transistors of the positive voltage shifting circuitry are in series with a first intermediate node of the first leg of the negative voltage shifting circuitry and the output node of the level shifting circuit; and
receiving the input signal at input circuitry including a plurality of inverters, each including a PMOS transistor and an NMOS transistor in series with a positive supply voltage and a negative or zero supply voltage, including:
operating a first inverter of the plurality of inverters to invert the input signal and output a first inverted input signal;
operating a second inverter of the plurality of inverters to invert the first inverted input signal and output a second inverted input signal to the first leg of the negative voltage shifting circuitry; and
operating a third inverter of the plurality of inverters to invert the second inverted input signal and output a third inverted input signal to the second leg of the negative voltage shifting circuitry.

11. The method of claim 10, wherein operating the negative voltage shifting circuitry includes:
providing the negative amplified voltage to the second plurality of high voltage transistors of the positive voltage shifting circuitry via the first intermediate node of the first leg of the negative voltage shifting circuitry when the input signal is the negative or zero supply voltage; and
providing the second inverted input signal to the second plurality of high voltage transistors of the positive voltage shifting circuitry via the first intermediate node of the first leg of the negative voltage shifting circuitry when the input signal is the positive supply voltage.

12. The method of claim 11, wherein operating the positive voltage shifting circuitry includes:
providing the negative amplified voltage at the output node of the level shifting circuitry when the first intermediate node of the first leg of the negative voltage shifting circuitry is the negative amplified voltage; and
providing the positive amplified voltage at the output node of the level shifting circuitry when the first intermediate node of the first leg of the negative voltage shifting circuitry is the positive supply voltage.

13. The method of claim 10, wherein the second plurality of high voltage transistors of the positive voltage shifting circuitry include:
a first NMOS transistor having a gate connected to the first intermediate node of the first leg of the negative voltage shifting circuitry; and
a first PMOS transistor having a gate connected to the first intermediate node of the first leg of the negative voltage shifting circuitry.

14. The method of claim 13, wherein:
the negative or zero supply voltage is between −0.5V and 0V;
the negative amplified voltage is between −4.5V and −3.5V;
the positive supply voltage is between 2V and 3V;
the positive amplified voltage is between 15V and 20V; and
a gate-to-source voltage and a drain-to-source voltage of the first PMOS transistor satisfy an acceptable voltage range (AVR) rating of the first PMOS transistor while the output node of the level shifting circuitry switches between the positive amplified voltage and the negative amplified voltage.

15. The method of claim 13, further comprising operating a high voltage pull-down transistor connected to the source of the first PMOS transistor and the negative amplified voltage, including controlling the high voltage pull-down transistor with a second intermediate node of the second leg of the negative voltage shifting circuitry.

16. The method of claim 10, wherein the outputting of the second inverted input signal to the first leg of the negative voltage shifting circuitry is before the outputting of the third inverted input signal to the second leg of the negative voltage shifting circuitry.

17. The method of claim 10, wherein:
the first plurality of NMOS transistors of the negative voltage shifting circuitry include a first NMOS transistor having its gate cross-coupled to the second input node, and a second NMOS transistor having its gate cross-coupled to the second intermediate node; and
the second plurality of NMOS transistors of the negative voltage shifting circuitry include a first NMOS transistor having its gate cross-coupled to the first input node, and a second NMOS transistor having its gate cross-coupled to the first intermediate node.

18. The method of claim 10, wherein the positive amplified voltage and the negative amplified voltage are read voltages for a plurality of word lines of a memory array of a data storage device.

19. A level shifting circuit, comprising:
means for down-shifting an input signal to a negative amplified voltage, including:
a first leg of a first plurality of NMOS transistors in series with a first input node and the negative amplified voltage; and
a second leg of a second plurality of NMOS transistors in series with a second input node and the negative amplified voltage;
means for up-shifting the input signal to a positive amplified voltage; including:
a first plurality of high voltage transistors in series with the positive amplified voltage and an output node of the level shifting circuit; and
a second plurality of high voltage transistors in series with a first intermediate node of the first leg and the output node of the level shifting circuit; and means for receiving the input signal at input circuitry including a plurality of inverters, each including a PMOS transistor and an NMOS transistor in series with a positive supply voltage and a negative or zero supply voltage, including:
- a first inverter of the plurality of inverters configured to invert the input signal and output a first inverted input signal;
- a second inverter of the plurality of inverters configured to invert the first inverted input signal and output a second inverted input signal to the first leg; and
- a third inverter of the plurality of inverters configured to invert the second inverted input signal and output a third inverted input signal to the second leg.

20. The level shifting circuit of claim 19, further comprising:
- means for providing the negative amplified voltage to the second plurality of high voltage transistors via the first intermediate node of the first leg when the input signal is the negative or zero supply voltage; and
- means for providing the second inverted input signal to the second plurality of high voltage transistors via the first intermediate node of the first leg when the input signal is the positive supply voltage.

* * * * *